United States Patent
Yoshida et al.

(10) Patent No.: US 9,399,428 B2
(45) Date of Patent: Jul. 26, 2016

(54) MIRROR DEVICE

(71) Applicant: Pioneer Corporation, Kawasaki-shi, Kanagawa (JP)

(72) Inventors: Ayako Yoshida, Kawasaki (JP); Kazuo Kuroda, Kawasaki (JP)

(73) Assignee: PIONEER CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/441,159

(22) PCT Filed: Nov. 8, 2012

(86) PCT No.: PCT/JP2012/078970
§ 371 (c)(1),
(2) Date: May 6, 2015

(87) PCT Pub. No.: WO2014/073071
PCT Pub. Date: May 15, 2014

(65) Prior Publication Data
US 2015/0298602 A1  Oct. 22, 2015

(51) Int. Cl.
*B60Q 3/02* (2006.01)
*H01L 51/52* (2006.01)
*H01L 27/32* (2006.01)

(52) U.S. Cl.
CPC .......... *B60Q 3/0226* (2013.01); *H01L 27/3211* (2013.01); *H01L 51/5271* (2013.01)

(58) Field of Classification Search
CPC .................................................. B60Q 3/0226
USPC ........................................................ 313/512
See application file for complete search history.

(56) References Cited

U.S. PATENT DOCUMENTS

2007/0096112 A1  5/2007  Hoshi
2007/0210700 A1  9/2007  Kato et al.
2011/0050082 A1  3/2011  Inoue et al.

FOREIGN PATENT DOCUMENTS

| JP | 2625177 A | 6/1989 |
|---|---|---|
| JP | 2003-217868 A | 7/2003 |
| JP | 2004-111195 A | 4/2004 |
| JP | 2006-156205 A | 6/2006 |
| JP | 2007-080579 A | 3/2007 |
| JP | 2008-192314 A | 8/2008 |
| JP | 2010-157515 A | 7/2010 |
| WO | 2005/034586 A | 4/2005 |

OTHER PUBLICATIONS

International Search Report and Written Opinion dated Feb. 19, 2013, issued for International Application No. PCT/JP2012/078970.

*Primary Examiner* — Joseph L Williams
(74) *Attorney, Agent, or Firm* — Procopio, Cory, Hargreaves & Savitch LLP

(57) ABSTRACT

A mirror device has a light-transmissive substrate and at least one organic EL element supported on the back surface of the light-transmissive substrate, and emits light from the front surface of the light-transmissive substrate. The organic EL element has an organic layer containing a light-emitting layer layered between a light-transmissive electrode and a reflection electrode that are opposite to each other. The light-transmissive electrode is formed on the light-transmissive substrate. The mirror device has a plurality of metal mirror surface portions that each have an area smaller than the area of the light-transmissive electrode and are distributed and disposed on the front surface of the light-transmissive substrate so as to be opposite to the light-emitting layer.

9 Claims, 10 Drawing Sheets

MIRROR DEVICE

TECHNICAL FIELD

The present invention relates to a mirror device that has a light-emitting function and contains an organic electroluminescent element.

BACKGROUND ART

An organic electroluminescent element is a light-emitting element that is configured by layering an anode, an organic layer containing a light-emitting layer, and a cathode in this order on a transparent glass substrate, and expresses electroluminescence (hereinafter referred to as EL) by injection of current in the organic layer through the anode and the cathode. The organic EL element is a self-emitting surface emission device, and is used for a display device and an illuminator.

As a mirror device, a mirror equipped with an EL illuminator in which an organic EL element is disposed around the mirror in a frame shape and an object such as the face and the like of a user can be reflected has been proposed (see Patent Literature 1).

A sun visor assembly for automotive vehicles with an illuminated rear-view mirror has also been proposed (see Patent Literature 2).

CITATION LIST

Patent Literature

Patent Literature 1: Japanese Patent Application Laid-Open No. 2003-217868
Patent Literature 2: Japanese Patent No. 2625177

SUMMARY OF INVENTION

Technical Problem

In the mirror equipped with an EL illuminator of Patent Literature 1, since a light source such as the organic EL element is disposed on a frame around the mirror, the area of the mirror decreases. The mirror has a defect in which light cannot be accurately applied to a portion of the face that the user wants to see.

In the sun visor assembly of Patent Literature 2, an illumination portion such as a lamp is directly provided in front of both sides of a mirror surface. Therefore, the sun visor assembly has a problem in which it is difficult to emit light uniformly.

In the mirror device, a light-emitting portion is added and disposed simply in front of and behind the mirror. Therefore, the mirror device has a defect in which the thickness of the whole mirror device increases.

As an example, an object of the present invention is to provide a mirror device that has a light-reflecting function and suppresses an increase in the thickness of the device to emit light in a forward direction.

Solution to Problem

A mirror device of the present invention is a mirror device that has a light-transmissive substrate and at least one organic EL element supported on the back surface of the light-transmissive substrate, and emits light from the front surface of the light-transmissive substrate, wherein the organic EL element has an organic layer containing a light-emitting layer layered between a light-transmissive electrode and a reflection electrode that are opposite to each other, the light-transmissive electrode is formed on the light-transmissive substrate, and the mirror device has a plurality of metal mirror surface portions that each have an area smaller than the area of the light-transmissive electrode and are distributed and disposed on the front surface of the light-transmissive substrate so as to be opposite to the light-emitting layer.

DESCRIPTION OF EMBODIMENTS

Hereinafter, embodiments of the present invention will be described with reference to the drawings.

First Embodiment

Figure 1:
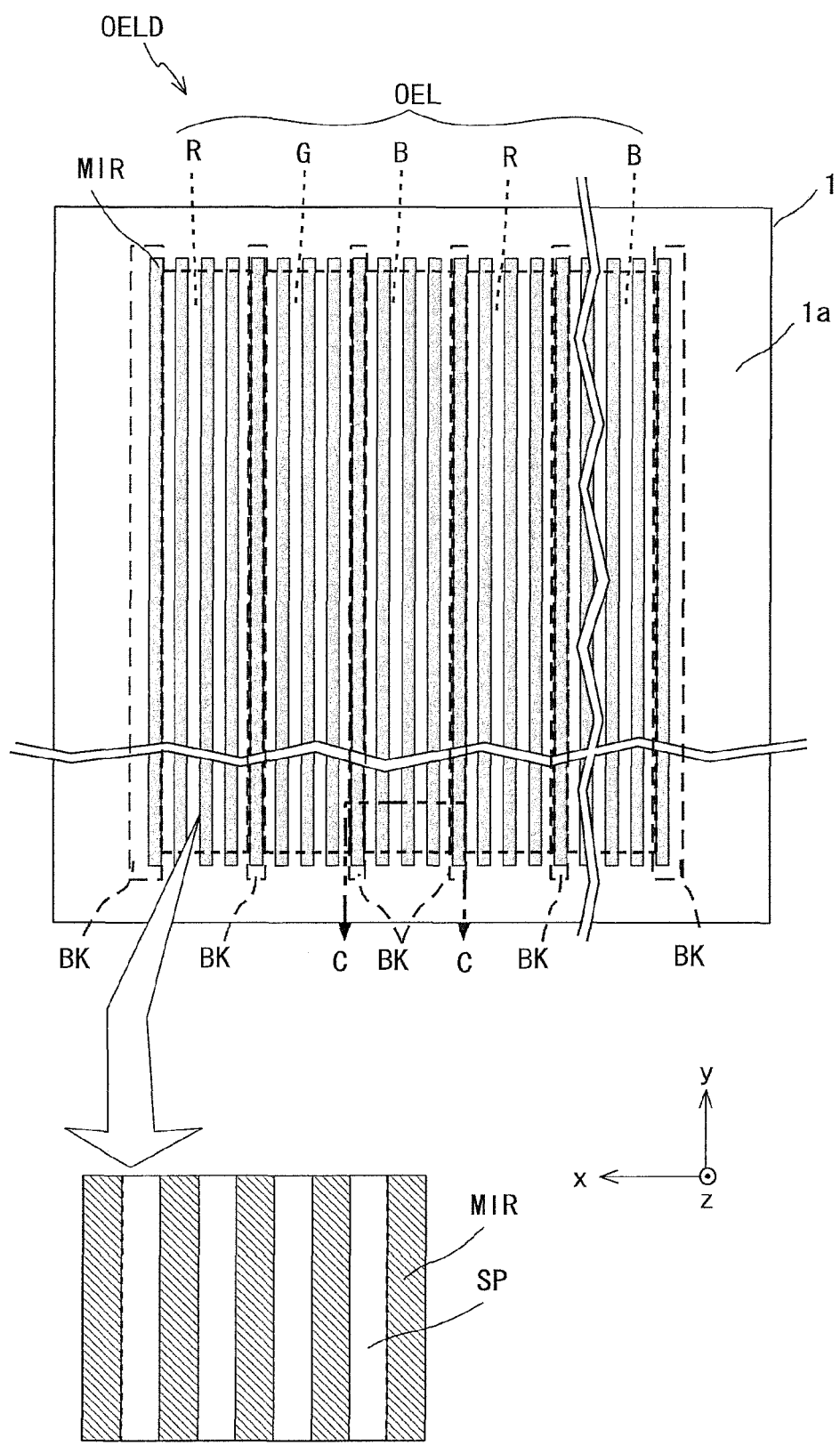
FIG. 1 is a front view of a part of a mirror device of an organic EL panel according to a first embodiment of the present invention which is cut out, and a partially enlarged front view thereof.

FIG. 1 shows a configuration of a mirror device that is an organic EL panel OELD according to a first embodiment of the present invention.

The organic EL panel OELD includes a plurality of organic EL elements OELs that are divided by banks BKs on a light-transmissive plate made of a glass or a resin as a substrate 1. For example, the banks BKs are made of a dielectric material such as an optical glass and an optical resin. The organic EL elements OELs are each a strip-shaped light-emitting portion that extends in a y direction of a xy main plane of the substrate 1. The organic EL elements OELs are groups of organic EL elements R, G, and B that emit light of different luminescent colors such as red R, green G, and blue B, respectively, from a front surface 1a of the light-transmissive substrate 1. The organic EL elements R, G, and B are aligned in parallel on the substrate 1. Each of sets of the organic EL elements OELs having RGB luminescent color that emits light with each of luminescent colors of red, green, and blue is aligned in an x direction.

The organic EL panel OELD has the banks, the organic EL elements, and a plurality of metal mirror surface portions MIRs that are distributed and disposed on the front surface 1a of the substrate 1. The metal mirror surface portions MIRs are configured in stripes so that the metal mirror surface portions MIRs as strip-shaped light-reflecting portions extending in the y direction and spaces SPs are alternately disposed in the x direction, as shown in FIG. 1. In an enlarged part of the metal mirror surface portions MIRs aligned in a matrix that is shown by a white arrow in FIG. 1, the metal mirror surface portions are shown with hatching.

When the metal mirror surface positions MIRs each are viewed from above as shown in FIG. 1, in the embodiment, the metal mirror surface portions MIRs each have such a width that covers each of the banks BKs, and the metal mirror surface portions MIRs with the same width are equally disposed on the light-emitting portions. Each of the metal mirror surface portions MIRs has an area smaller than the area of each of the light-emitting portions of the organic EL elements OELs. During driving of the elements, light of the organic EL elements OELs can be extracted from the spaces SPs between the metal mirror surface portions MIRs as shown in FIG. 1.

Thus, the metal mirror surface portions MIRs each have the same shape and the same area, and are disposed in uniform distribution. Alternatively, the shapes and the areas of the metal mirror surface portions MIRs may be different, or not the same, as long as the areas are smaller than the areas of the light-emitting portions. Herein, the metal mirror surface portions MIRs and the spaces SPs are each configured at uniform intervals. For example, when the widths of each side of the metal mirror surface portions MIRs are 0.05 mm or less, which cannot be distinguished with the naked eye, and distances between the metal mirror surface portions MIRs and the organic EL elements OELs are as short as 0.05 mm or less, light is leaked from the spaces SPs during driving, and the organic EL panel can be utilized as a mirror that emits light through the whole surface. In addition, the organic EL panel can function as one mirror during non-driving of the elements. When the brightnesses of the organic EL elements are adjusted each or for each group of colors, light that is recognized as a single luminescent color by mixing red, green, and blue lights at any ratio is emitted from the front surface of the substrate 1 as a light extraction surface. All the organic EL elements OELs are connected to an element-driving portion, which is not shown in the drawing.

Figure 2:
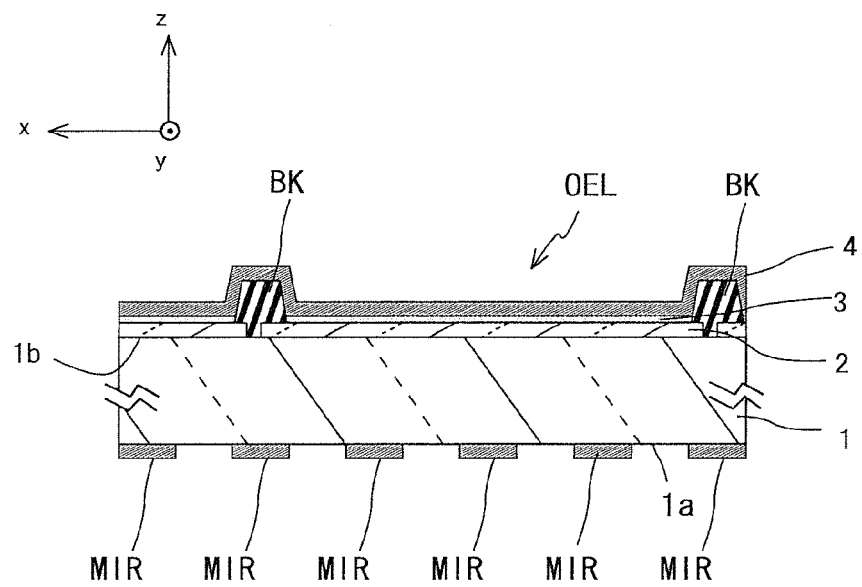
FIG. 2 is a cross-sectional view taken along line C-C in FIG. 1.

As shown in FIG. 2, each of the organic EL elements OELs is configured by layering a light-transmissive electrode 2, an organic layer 3 containing a light-emitting layer, and a reflection electrode 4 on a back surface 1b of the substrate 1 between the banks BKs. The strip-shaped light-transmissive electrode 2 is aligned for each of the organic EL elements OELs so as to extend in parallel to the y direction between the banks BKs on the substrate 1. The light-transmissive electrode 2 of each of the organic EL elements OELs is connected to the element-driving portion, which is not shown in the drawing. For example, a substrate 1 in which metal mirror surface portions MIRs and light-transmissive electrodes 2 are each formed at predetermined positions on the front surface and the back surface in a pattern is prepared, and banks BKs having a forward-tapered structure are formed from a light-transmissive dielectric material in the y direction between sides of the adjacent light-transmissive electrodes 2 by photolithography or the like. A predetermined organic layer 3 is formed on the light-transmissive electrodes 2 between the banks BKs by an inkjet method or the like. Subsequently, a film is formed from a reflection electrode material on the organic layer 3 between the banks BKs and the top surfaces of the banks BKs by a vapor deposition method or the like.

Since the banks BKs have a so-called forward-tapered structure, in which sides of the banks spread toward the light-transmissive electrode 2, the reflection electrode 4 becomes a common electrode having the same electric potential over the organic EL elements OELs. The mirror device of the embodiment functions as a so-called bottom emission type organic EL panel in which light generated in the organic layer 3 by applying a voltage to the light-transmissive electrodes 2 and the reflection electrode 4 is extracted from the front surface 1a of the substrate 1.

Figure 3:
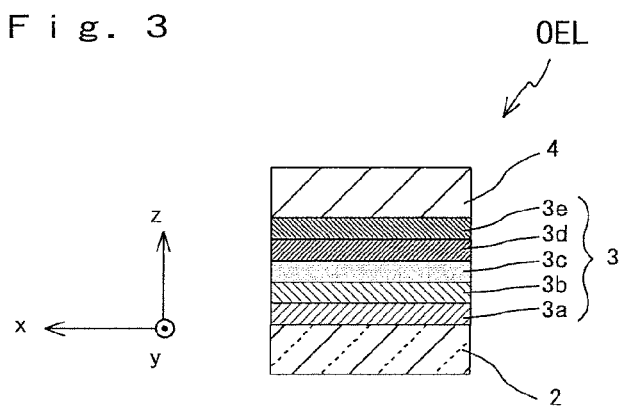
FIG. 3 is an enlarged cross-sectional view of a part of the mirror device of the organic EL panel according to the first embodiment.

As shown in FIG. 3, when the light-transmissive electrode 2 is an anode and the reflection electrode 4 is a cathode, the organic layer 3 of each of the organic EL elements OELs is typically configured by layering a hole injection layer 3a, a hole transport layer 3b, a light-emitting layer 3c, an electron transport layer 3d, and an electron injection layer 3e in this order. Further, in the layered structure of the organic layer 3, the components except for the substrate may be layered in reverse order. The organic layer 3 is not limited to this layered structure, and for example, may have a layered structure that includes at least a light-emitting layer by adding a hole blocking layer (not shown) between the light-emitting layer 3c and the electron transport layer 3d, or includes a charge transport layer usable as another layer. The organic layer 3 may be configured so that the layered structure does not include a hole transport layer 3b, a hole injection layer 3a, or a hole injection layer 3a and an electron transport layer 3d.

[Light-Transmissive Electrode]

The light-transmissive electrode 2 as an anode may be made of indium-tin-oxide (ITO), ZnO, ZnO—$Al_2O_3$ (i.e., AZO), $In_2O_3$—ZnO (i.e., IZO), $SnO_2$—$Sb_2O_3$ (i.e., ATO), or $RuO_2$. It is preferable that a material having a transmittance of at least 10% or more in the wavelength of light emitted from the light-emitting layer be selected for the light-transmissive electrode 2. The light-transmissive electrode 2 usually has a single-layer structure, but may have a layered structure including a metal thin film. For example, as a material for the metal thin film, an appropriate metal such as tin, magnesium, indium, calcium, aluminum, and silver, or an alloy thereof is used. Specific examples thereof may include a magnesium-silver alloy, a magnesium-indium alloy, and an aluminum-lithium alloy. A silver thin film with a thickness of 20 nm as the metal thin film has a transmittance of 50%. An Al film with a thickness of 10 nm as the metal thin film has a transmittance of 50%. A magnesium-silver alloy film with a thickness of 20 nm as the metal thin film has a transmittance of 50%. The configuration of the metal thin film depends on a material, a film forming method, and a condition. However, when the lower limit of the film thickness is 5 nm, conductivity can be secured.

[Hole Injection Layer]

It is preferable that the hole injection layer 3a be a layer containing an electron-accepting compound (i.e., hole-transporting compound).

From the viewpoint of charge injection barrier from the anode into the hole injection layer, it is preferable that the hole-transporting compound be a compound having an ionization potential of 4.5 eV to 6.0 eV. Examples of the hole-transporting compound may include an aromatic amine derivative, a phthalocyanine derivative typified by copper phthalocyanine (so-called CuPc), a porphyrin derivative, an oligothiophene derivative, a polythiophene derivative, a benzyl phenyl derivative, a compound having a tertiary amine connected through a fluorene group, a hydrazone derivative, a silazane derivative, a silanamine derivative, a phosphamine derivative, a quinacridone derivative, a polyaniline derivative, a polypyrrole derivative, a polyphenylenevinylene derivative, a polythienylenevinylene derivative, a polyquinoline derivative, a polyquinoxaline derivative, and carbon. The derivative used herein includes, for example, in the case of an aromatic amine derivative, an aromatic amine itself and a compound having an aromatic amine as a main skeleton, and the derivative may be a polymer or a monomer.

As the hole-transporting compound, a conductive polymer (so-called PEDOT/PSS) obtained by polymerizing 3,4-ethylenedioxythiophene as a polythiophene derivative in a high-molecular-weight polystyrenesulfonic acid is also preferred. Further, the terminal of the polymer of PEDOT/PSS may be capped with methacrylate or the like.

[Hole Transport Layer]

As a material for the hole transport layer 3b, a material conventionally used as a constituent material for a hole transport layer may be used. Examples thereof may include those described as examples of the hole-transporting compound used in the hole injection layer described above. Examples thereof may include an arylamine derivative, a fluorene derivative, a spiro derivative, a carbazole derivative, a pyridine derivative, a pyrazine derivative, a pyrimidine derivative, a triazine derivative, a quinoline derivative, a phenanthroline derivative, a phthalocyanine derivative, a porphyrin derivative, a silole derivative, an oligothiophene derivative, a condensed polycyclic aromatic derivative, and a metal complex. Examples thereof may also include a polyvinyl carbazole derivative, a polyarylamine derivative, a polyvinyl triphenylamine derivative, a polyfluorene derivative, a polyarylene derivative, a polyarylene ether sulfone derivative containing tetraphenyl benzidine, a polyarylene vinylene derivative, a polysiloxane derivative, a polythiophene derivative, and a poly(p-phenylene vinylene) derivative. These may be any of an alternating copolymer, a random polymer, a block polymer, and a graft copolymer, and may also be a polymer having a branched main chain and three or more terminals, so-called a dendrimer.

[Light-Emitting Layer]

The light-emitting layer 3c may be a light-emitting layer of independently emitting red light, green light, and blue light, or a mixed light-emitting layer thereof. Alternatively, the light-emitting layer may contain a compound having a hole-transporting property (hole-transporting compound) or a compound having an electron-transporting property (electron-transporting compound). An organic EL material may be used as a dopant material, and the hole-transporting compound, the electron-transporting compound, or the like may be appropriately used as a host material. The organic EL material is not particularly limited, and a substance that emits light at a desired emission wavelength and provides good light-emitting efficiency may be used.

As the organic EL material, any known material can be applied. For example, the material may be a fluorescent material or a phosphorescent material. From the viewpoint of internal quantum efficiency, the phosphorescent material is preferably used. The light-emitting layer may have a single-layer structure or if desired, a multilayer structure made from a plurality of materials. For example, the fluorescent material is used for a blue light-emitting layer and the phosphorescent material is used for a green light-emitting layer and a red light-emitting layer. Various materials may be used in combination. Further, a diffusion prevention layer may also be provided between the light-emitting layers.

Examples of a fluorescent material exhibiting blue luminescence (blue fluorescent dye) may include naphthalene, perylene, pyrene, chrysene, anthracene, coumarin, p-bis(2-phenylethenyl)benzene, and derivatives thereof.

Examples of a fluorescent material exhibiting green luminescence (green fluorescent dye) may include a quinacridone derivative, a coumarin derivative, and an aluminum complex such as tris(8-hydroxy-quinoline)aluminum (Alq3).

Examples of a fluorescent material exhibiting yellow luminescence (yellow fluorescent dye) may include rubrene and a perimidone derivative.

Examples of a fluorescent material exhibiting red luminescence (red fluorescent dye) may include a 4-(dicyanomethylene)-2-methyl-6-(p-dimethylaminostyryl)-4H-pyran (DCM)-based compound, a benzopyran derivative, a rhodamine derivative, a benzothioxanthene derivative, and azabenzothioxanthene.

Examples of the phosphorescent material may include an organometallic complex containing metal selected from Groups 7 to 11 of the long-periodic table (hereinafter, unless particularly otherwise noted, "the periodic table" is intended to refer to the long-periodic table). Preferable examples of metal selected from Groups 7 to 11 of the periodic table may include ruthenium, rhodium, palladium, silver, rhenium, osmium, iridium, platinum, and gold. A ligand of the complex is preferably a ligand in which a (hetero)) aryl group is coupled with pyridine, pyrazole, phenanthroline, or the like, such as a (hetero)arylpyridine ligand and a (hetero)arylpyrazole ligand, and particularly preferably a phenylpyridine ligand or a phenylpyrazole ligand. Here, the (hetero)aryl represents an aryl group or a heteroaryl group.

Specific examples of the phosphorescent material may include tris(2-phenylpyridine) iridium (so-called Ir(ppy)3), tris(2-phenylpyridine) ruthenium, tris(2-phenylpyridine) palladium, bis(2-phenylpyridine) platinum, tris(2-phenylpyridine) osmium, tris(2-phenylpyridine) rhenium, octaethyl platinum porphyrin, octaphenyl platinum porphyrin, octaethyl palladium porphyrin, and octaphenyl palladium porphyrin.

The light-emitting layer may contain a hole-transporting compound as its constituent material. Among hole-transporting compounds, examples of a hole-transporting compound having a low molecular weight may include various compounds described as the examples of the hole-transporting compound in the hole injection layer 3a described above, aromatic diamines including two or more tertiary amines and two or more condensed aromatic rings substituted with nitrogen atoms, which is typified by diphenyl naphthyl diamine (so-called α-NPD), an aromatic amine compound having a starburst structure such as 4,4',4"-tris(1-naphthyl phenylamino)triphenylamine, an aromatic amine compound having a tetramer of triphenylamine, and a spiro compound such as 2,2',7,7'-tetrakis-(diphenylamino)-9,9'-spirobifluorene.

The light-emitting layer may contain an electron-transporting compound as its constituent material. Among electron-transporting compounds, examples of an electron-transporting compound having a low molecular weight may include 2,5-bis(1-naphthyl)-1,3,4-oxadiazole (so-called BND), 2,5-bis(6'-(2',2"-bipyridyl))-1,1-dimethyl-3,4-diphenylsilole (so-called PyPySPyPy), basophenanthroline (so-called BPhen), 2,9-dimethyl-4,7-diphenyl-1,10-phenanthroline (so-called BCP, bathocuproin), 2-(4-biphenylyl)-5-(p-tert-butylphenyl)-1,3,4-oxadiazole (so-called tBu-PBD), and 4,4'-bis(9H-carbazol-9-yl)biphenyl (so-called CBP).

[Electron Transport Layer]

The electron transport layer $3d$ is provided for the purpose of further improving the emission efficiency of the organic EL elements, and is formed from an electron-transporting compound capable of efficiently transporting electrons injected from a cathode toward the light-emitting layer between electrodes to which an electric field is applied.

As the electron-transporting compound used for the electron transport layer, a compound that has high electron injection efficiency from the cathode or the electron injection layer $3e$ and high electron mobility and is capable of efficiently transporting injected electrons is usually used. Examples of a compound satisfying such conditions may include a metal complex of 10-hydroxybenzo[h]quinoline such as Alq3, an oxadiazole derivative, a distyryl biphenyl derivative, a silole derivative, a 3-hydroxyflavone metal complex, a 5-hydroxyflavone metal complex, a benzoxazole metal complex, a benzothiazole metal complex, trisbenzimidazolylbenzene, a quinoxaline compound, a phenanthroline derivative, 2-tert-butyl-9,10-N,N'-dicyanoanthraquinonediimine, n-type hydrogenated amorphous silicon carbide, n-type zinc sulfide, and n-type zinc selenide.

[Electron Injection Layer]

The electron injection layer $3e$ fulfills a role of efficiently injecting electrons injected from the cathode into the electron transport layer or the light-emitting layer. For the electron injection layer $3e$, an organic electron transport compound typified by a nitrogen-containing heterocyclic compound such as bathophenanthroline and a metal complex such as an aluminum complex of 8-hydroxyquinoline is used. When the electron injection layer $3e$ of the organic electron transport compound is doped with an electron-donating material, the electron injection efficiency can be enhanced. As the electron-donating material, for example, an alkali metal such as sodium and cesium, an alkali earth metal such as barium and calcium, a compound thereof ($CsF$, $Cs_2CO_2$, $Li_2O$, and $LiF$), or an alkali metal such as sodium, potassium, cesium, lithium, and rubidium is used.

As a procedure for forming each layer in the organic layer 3, a dry coating method such as a sputtering method and a vacuum deposition method and a wet coating method such as screen printing, a spraying method, an inkjet method, a spin coating method, gravure printing, and a roll coater method are known. For example, a hole injection layer, a hole transport layer, and a light-emitting layer may be formed by a wet coating method so that each film thickness is uniform, and an electron transport layer and an electron injection layer may be each formed in turn by a dry coating method so that each film thickness is uniform. Further, all functional layers may be formed in turn by the wet coating method so that each film thickness is uniform.

[Reflection Electrode]

In order to efficiently inject electrons, it is preferable that a material for the reflection electrode 4 as a cathode include a metal having a low work function. For example, an appropriate metal such as tin, magnesium, indium, calcium, aluminum, and silver, or an alloy thereof is used. Specific examples thereof may include an electrode made of an alloy having a low work function, such as a magnesium-silver alloy, a magnesium-indium alloy, and an aluminum-lithium alloy. The reflection electrode 4 may be formed as a single-layer film or a multilayer film on the organic layer 3 by a sputtering method or a vacuum deposition method. The film thickness is not restricted as long as it can maintain the reflection action of the reflection electrode 4.

Figure 4:
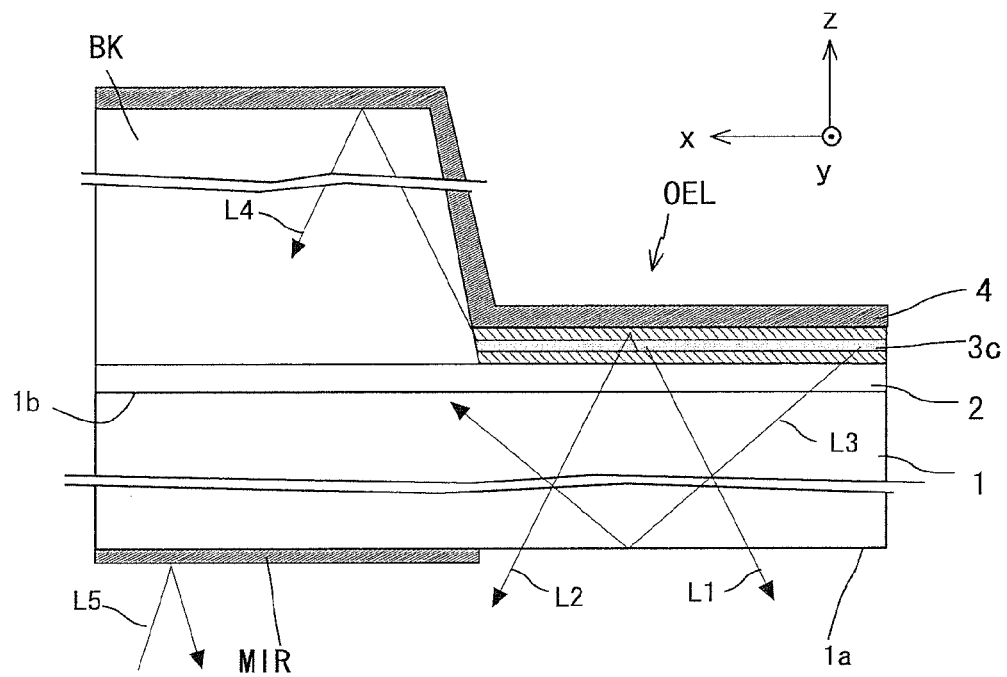
FIG. 4 is a schematic cross-sectional view of a part of the organic EL panel which shows an operation of the mirror device of the organic EL panel shown in FIG. 1.

Next, the operation of the organic EL panel of the mirror device will be described with reference to FIG. 4. When a driving voltage is applied to the light-emitting layer $3c$ in the organic layer through the light-transmissive electrode 2 and the reflection electrode 4, light generated in the light-emitting layer $3c$ passes through the light-transmissive electrode 2, is reflected on the reflection electrode 4, and passes through the light-transmissive electrode 2. Thus, several tens percent of the light is extracted from the front surface of the light-transmissive substrate 1. Specifically, of light emitted from the light-emitting layer $3c$, light L1 with an angle that is less than the critical angle of each interface passes through the light-transmissive electrode 2 at a region including no metal mirror surface portion MIR, and proceeds toward the glass substrate 1. Other light L2 proceeding toward the reflection electrode 4 is reflected on the reflection electrode 4, passes through the light-emitting layer $3c$, passes through the light-transmissive electrode 2, and proceeds toward the substrate 1. The light L1 and the light L2 are emitted toward a front space of the substrate 1 at the region including no metal mirror surface portion MIR. Remaining light L3 with an angle that exceeds the critical angle is totally reflected and proceeds toward the bank BK. Light L4 emitted from an edge face of the light-emitting layer $3c$ and light L4 proceeding in a transverse direction also enter the bank BK, are repeatedly reflected and attenuated, passes through the light-transmissive electrode 2, proceeds toward the substrate 1, and are partially emitted toward the front space of the substrate 1. In contrast, when a part of light L5 from the outside that enters from the space on the front surface side of the substrate 1 is reflected on the metal mirror portion MIR, and the other part thereof passes through the region including no mirror surface portion MIR, the light is reflected on the reflection electrode 4, and emitted outward.

Hereinafter, in modified examples of the first embodiment, a portion different from that in the first embodiment will be mainly described with reference to FIGS. 5 to 10. Components represented by the same reference signs as in the first embodiment are the same as described above, and therefore the detailed description thereof will be omitted.

Figure 5:
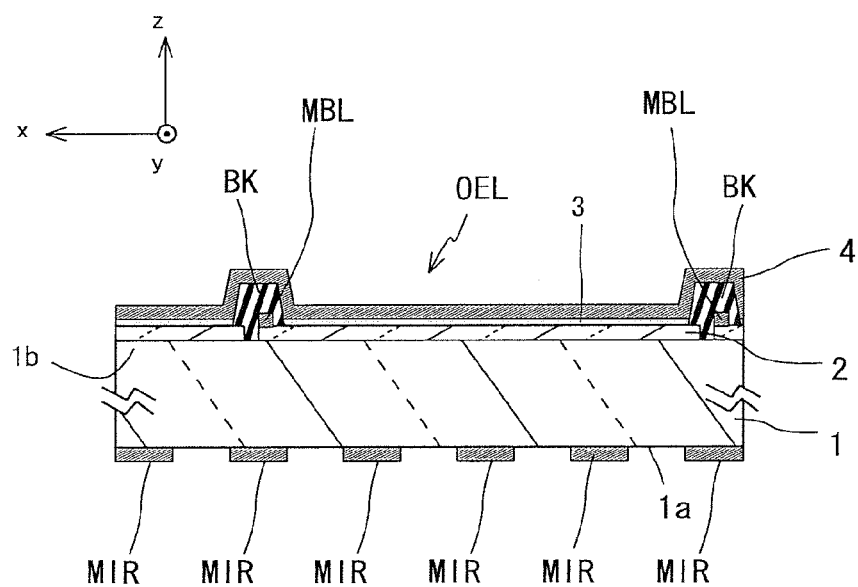
FIG. 5 is a schematic cross-sectional view of a part of a mirror device of an organic EL panel according to a modified example of the first embodiment.

FIG. 5 shows a modified example of a mirror device that is the same as in the embodiment shown in FIG. 2 except that a metal bus line MBL is buried in a bank BK. In this case, the metal bus line MBL that is electrically connected to a light-transmissive electrode 2 is formed on each end edge of the light-transmissive electrode 2 buried in the bank BK so as to extend in a y direction. Therefore, power supply current can be efficiently supplied to the light-transmissive electrode 2.

Figure 6:
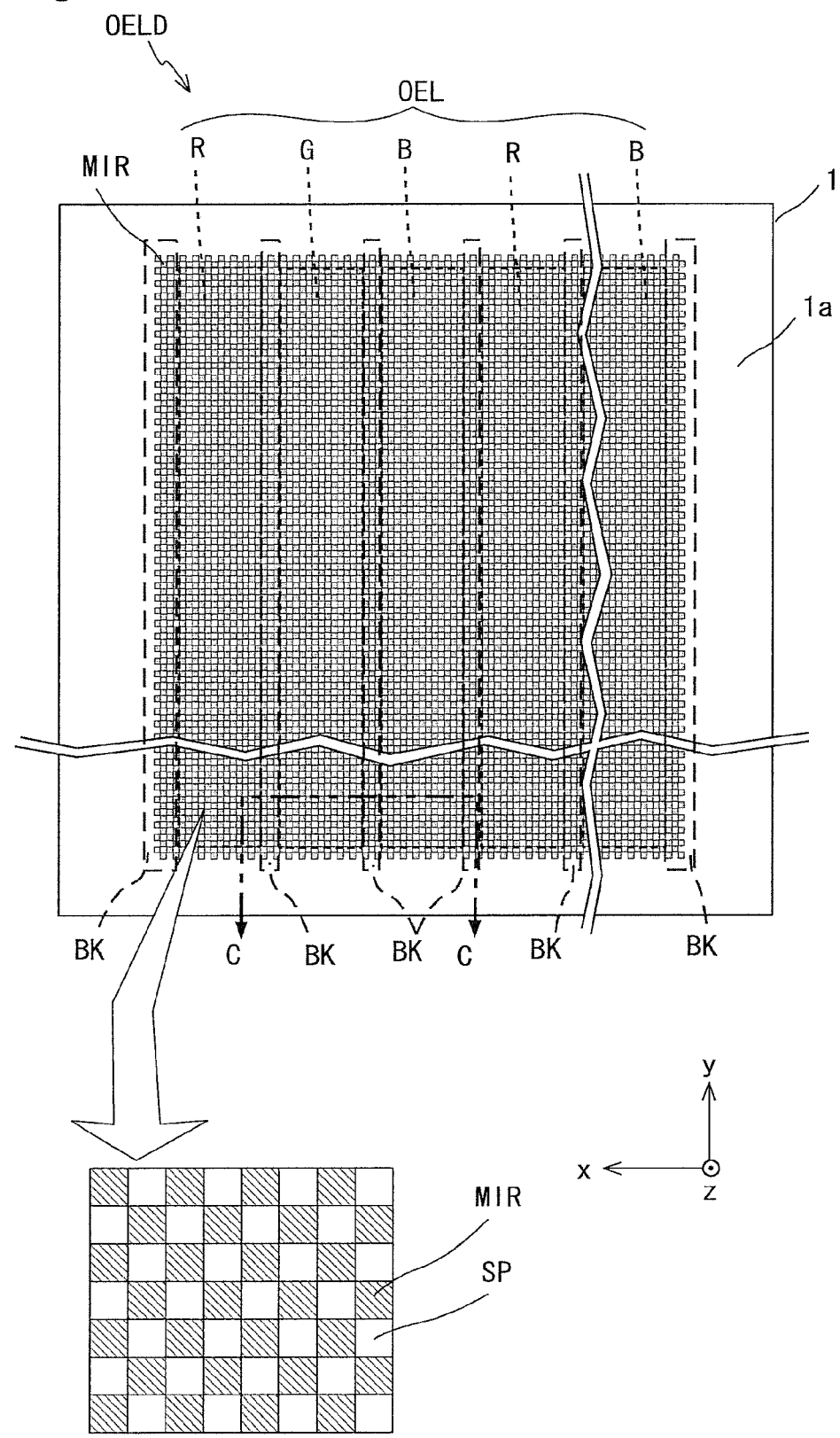
FIG. 6 is a front view of a part of a mirror device of an organic EL panel according to another modified example of the first embodiment which is cut out, and a partially enlarged front view thereof.

FIG. 6 shows a modified example of a mirror device that is the same as in the embodiment shown in FIG. 1 except that each of a plurality of metal mirror surface portions MIRs is rectangular, and the metal mirror surface portions MIRs and spaces SPs are each alternately disposed in a fine check shape, that is, in a matrix, in an x direction and a y direction on a xy main plane. In this case, uniform reflection and luminescent can be achieved as compared with metal mirror surface portions in stripes. Since banks BKs are formed from a light-transmissive dielectric material, for example, a transparent or scattering material, light can be further extracted from the banks BKs through a substrate 1.

Figure 7:
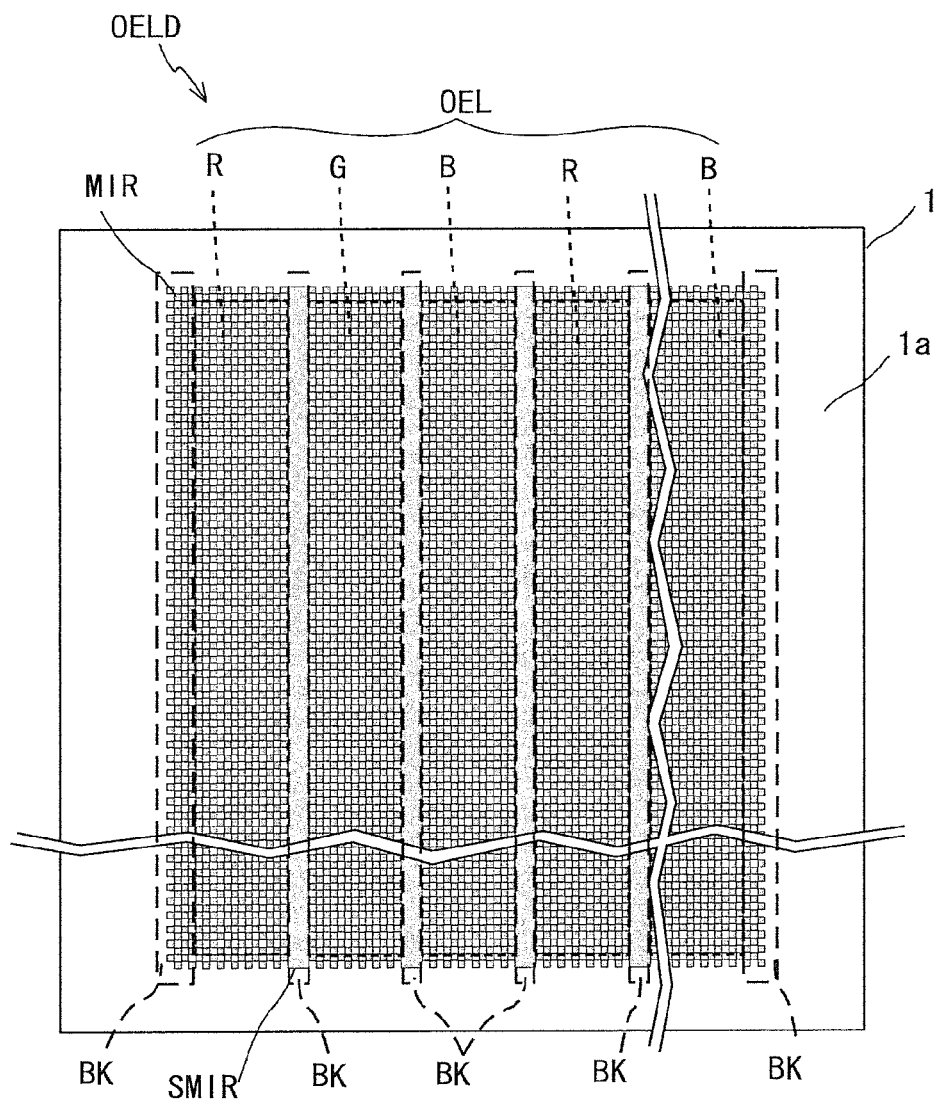
FIG. 7 is a partially enlarged front view of a part of a mirror device of an organic EL panel according to another modified example of the first embodiment.

FIG. 7 shows a modified example of a mirror device that is the same as in the embodiment shown in FIG. 1 except that portions opposite to banks BKs are configured so as to be covered with strip-shaped metal mirror surface portions SMIRs having the width of the banks BKs. In this case, the reflected light amount can be increased depending on the metal mirror surface portions in stripes.

Figure 8:
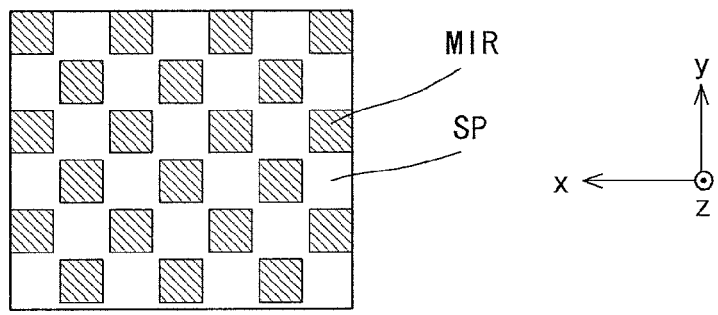
FIG. 8 is a partially enlarged front view of a part of a mirror device of an organic EL panel according to further another modified example of the first embodiment.

FIG. 8 shows a modified example of a mirror device that is the same as in the embodiment shown in FIG. 6 except that a plurality of metal mirror surface portions MIRs are each separated, isolated, and disposed in a so-called dot shape. In this case, since the area of spaces SPs can be made larger than the area of the metal mirror surface portions MIRs, the extraction efficiency of emitted light is improved.

Figure 9:
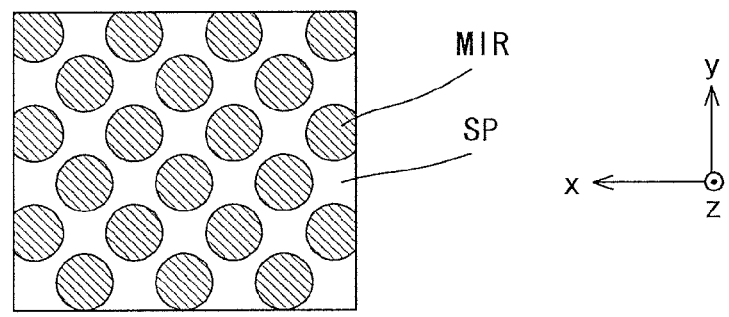
FIG. 9 is a partially enlarged front view of a part of a mirror device of an organic EL panel according to yet another modified example of the first embodiment.

FIG. 9 shows a modified example of a mirror device that is the same as in the embodiment shown in FIG. 8 except that a plurality of metal mirror surface portions MIRs are each separated, isolated, and disposed, and the shape of each of the metal mirror surface portions MIRs is a circle. As the shape of the metal mirror surface portions MIRs, various kinds of shapes such as a rectangle, a polygon, a circle, and an ellipse can be utilized. In this case, since the area of spaces SPs can be changed and set relative to the area of the metal mirror surface portions MIRs, the degree of freedom that sets a ratio such as the reflection amount of light from the outside and the extraction efficiency of emitted light is improved.

In an example in which the metal mirror surface portions MIRs are disposed in a dot shape, an aggregation having a shape in which apart of each dot is connected can be utilized.

Figure 10:
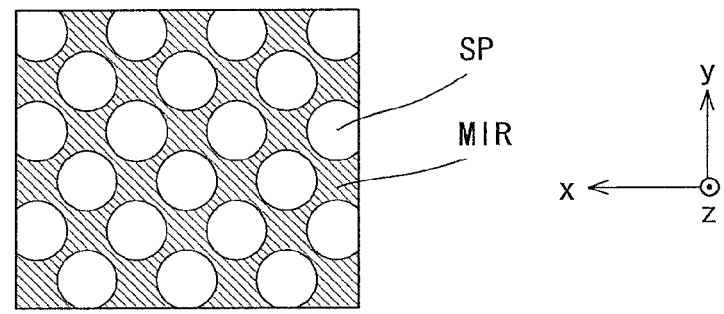
FIG. 10 is a partially enlarged front view of a part of a mirror device of an organic EL panel according to another modified example of the first embodiment.

FIG. 10 shows a modified example of a mirror device that is the same as in the embodiment shown in FIG. 9 except that a plurality of metal mirror surface portions MIRs are in such a mesh shape that the metal mirror surface portions MIRs each expand in x and y directions. In this case, since the area of spaces SPs is changed and determined relative to the area of the metal mirror surface portions MIRs.

The mirror device having the above-described configuration can be utilized as an illuminated mirror such as a hand mirror and a vanity mirror, and can be utilized as an advertising board or a mirror with an illuminator attached to a pillar or a ceiling to make a space of a store look wide.

Second Embodiment

Hereinafter, in a second embodiment, a portion different from that in the first embodiment will be mainly described with reference to FIG. 11. Components represented by the same reference signs as in the first embodiment are the same as described above, and therefore the detailed description thereof will be omitted.

Figure 11:
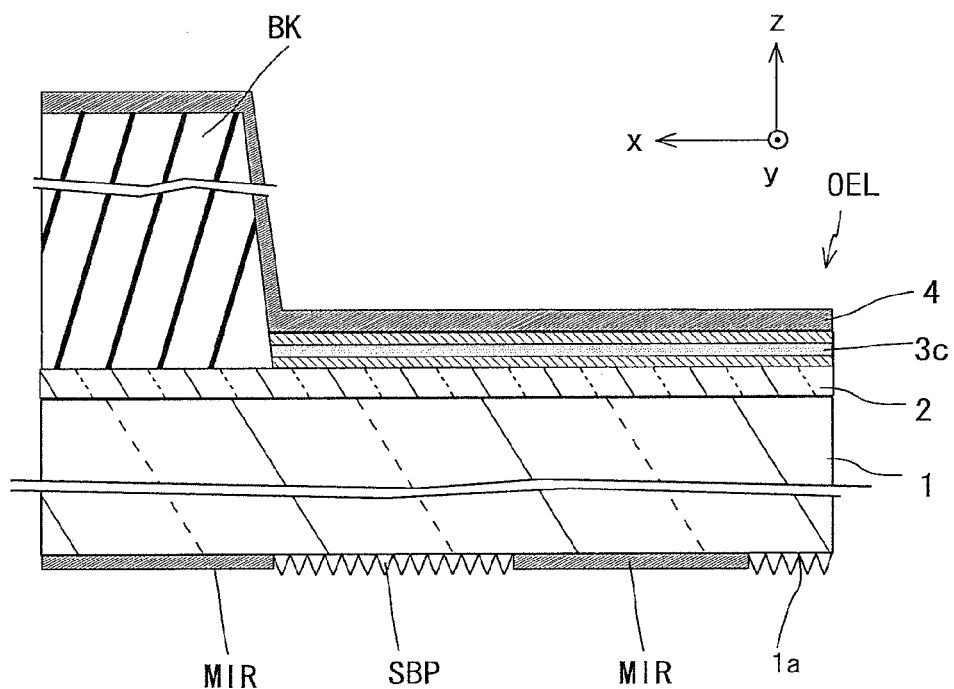
FIG. 11 is a schematic cross-sectional view of a part of a mirror device of an organic EL panel according to a second embodiment of the present invention.

As shown in FIG. 11, the second embodiment has a configuration that is the same as in the first embodiment except that a light extraction structure SBP is distributed and disposed on a front surface 1a of a substrate 1 except for a metal mirror surface portion MIR so as to cover a light-emitting portion of an organic EL element OEL and have an area exceeding the area of the light-emitting portion. In this case, the extraction efficiency of emitted light can be improved due to the light extraction structure SBP. The light extraction structure SBP can be formed as a rough surface structure at a predetermined portion on the front surface 1a of the substrate 1, for example, by a water-blasting method or a fine sand-blasting method, or may be formed at a predetermined portion on the front surface 1a of the substrate 1 by imprinting.

Light from the outside impinges on the metal mirror surface portion MIR and is reflected by the same. Light emitted from a light-emitting layer passes through an organic layer and a light-transmissive electrode 2, and proceeds toward the glass light-transmissive substrate 1, light with an angle that is equal to or more than a critical angle is totally reflected on an interface between the light-transmissive electrode 2 and the light-transmissive substrate 1, and the remaining light enters the glass light-transmissive substrate 1. The light that enters the light-transmissive substrate 1 enters the light extraction structure SBP at a region including no metal mirror surface portion MIR, and a part of the light is totally reflected due to randomness of the rough surface structure, and the remaining part is extracted into an air layer. Like the light that is reflected on the interface between the light-transmissive electrode 2 and the substrate 1, light that is reflected at a region including the metal mirror surface portion MIR is reflected on a reflection electrode 4, apart of the light is extracted from the rough surface structure into an air layer, and the remaining part is reflected.

Third Embodiment

Hereinafter, in a third embodiment, a portion different from that in the first embodiment will be mainly described with reference to FIG. 12. Components represented by the same reference signs as in the first embodiment are the same as described above, and therefore the detailed description thereof will be omitted.

Figure 12:
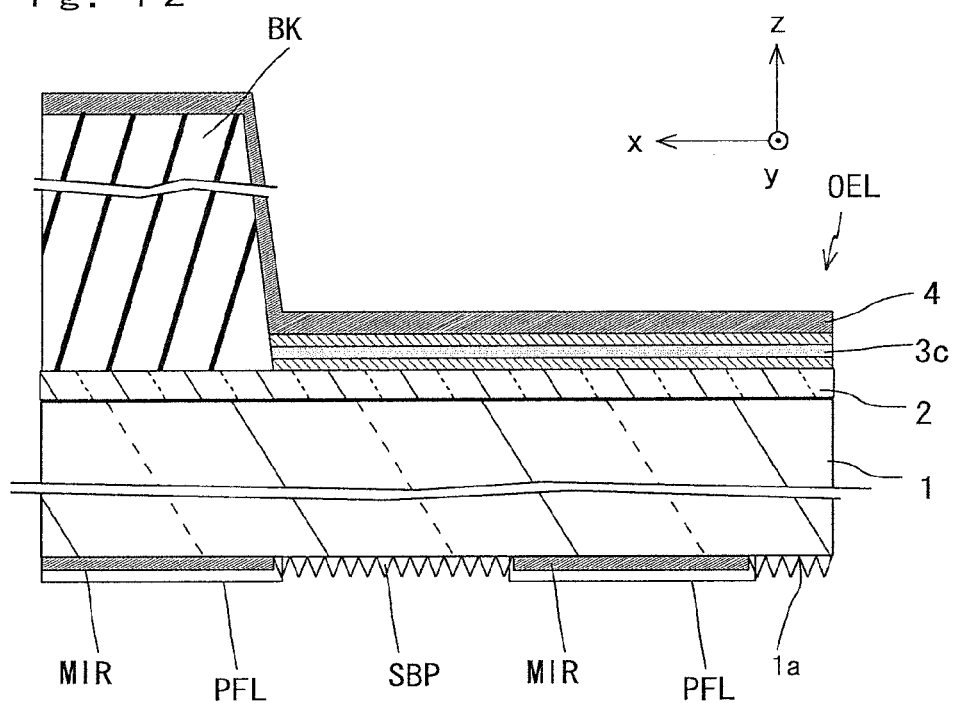
FIG. 12 is a schematic cross-sectional view of a part of a mirror device of an organic EL panel according to a third embodiment of the present invention.

As shown in FIG. 12, the third embodiment has the same configuration as in the second embodiment except that a protection film PFL is formed on a metal mirror surface portion MIR. In this case, the protection film. PFL protects the surface of the metal mirror surface portion MIR. An operation in the embodiment is the same as in the second embodiment except that light from the outside passes through the protection film PFL and is reflected on the metal mirror surface portion MIR.

Fourth Embodiment

Hereinafter, in a fourth embodiment, a portion different from that in the first embodiment will be mainly described with reference to FIG. 13. Components represented by the same reference signs as in the first embodiment are the same as described above, and therefore the detailed description thereof will be omitted.

Figure 13:
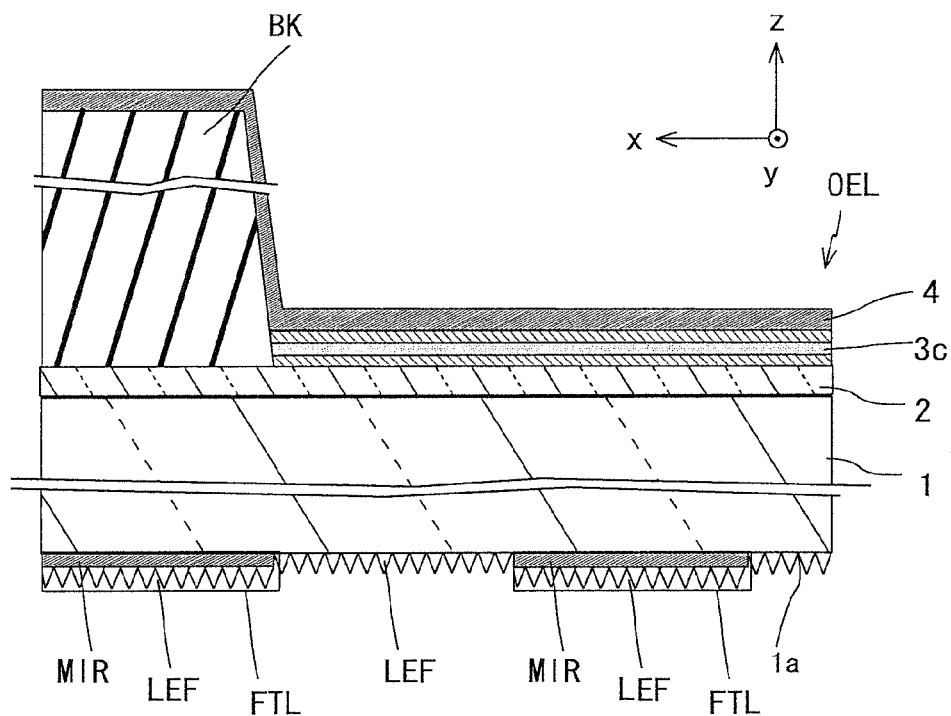
FIG. 13 is a schematic cross-sectional view of a part of a mirror device of an organic EL panel according to a fourth embodiment of the present invention.

As shown in FIG. 13, the fourth embodiment has a configuration that is the same as in the first embodiment except that a light extraction film LEF is used as a light extraction structure so as to cover a light-emitting portion of an organic EL element OEL and have an area exceeding the area of the light-emitting position, and is attached to a front surface 1a of a substrate 1 and a metal mirror surface portion MIR, and a flattening layer FTL is provided only on the metal mirror surface portion MIR. In this case, the extraction efficiency of emitted light can be improved due to the light extraction film LEF. A light extraction structure SBP is a light extraction film LEF having a concavo-convex structure of irregularities in several tens of nm to μm on one surface. The light extraction structure is formed by attaching the other surface of the film. The shape of the concavo-convex structure may be a shape capable of scattering light, and for example, the cross-sectional shape thereof may be a hemisphere, a trapezoid, or a triangle. The light extraction film. LEF is made of a transparent resin such as an acrylic resin, polyethylene, polypropylene, polyethylene terephthalate, polymethyl methacrylate, polystyrene, polyether sulfone, polyarylate, a polycarbonate resin, polyurethane, polyacrylonitrile, polyvinyl acetal, polyamide, polyimide, a diallyl phthalate resin, a cellulose resin, polyvinyl chloride, polyvinylidene chloride, and polyvinyl acetate.

The light extraction film LEF is further attached to the metal mirror surface portion MIR, and gaps between the concavo and convex portion of the concavo-convex structure only on the metal mirror surface portion MIR are filled with a transparent flattening material having the same refractive index as that of the light extraction film LEF. Thus, a region of the light extraction film LEF having a random shape is buried with the transparent material having the same refractive index, to obtain the flattening layer FTL as a flat protection film. An operation in the embodiment is the same as in the second embodiment except that light from the outside passes through the flattening layer FTL and the light extraction film LEF and impinges on the metal mirror surface portion MIR and is reflected by the same.

Fifth Embodiment

Hereinafter, in a fifth embodiment, a portion different from that in the first embodiment will be mainly described with reference to FIG. 14. Components represented by the same reference signs as in the first embodiment are the same as described above, and therefore the detailed description thereof will be omitted.

Figure 14:
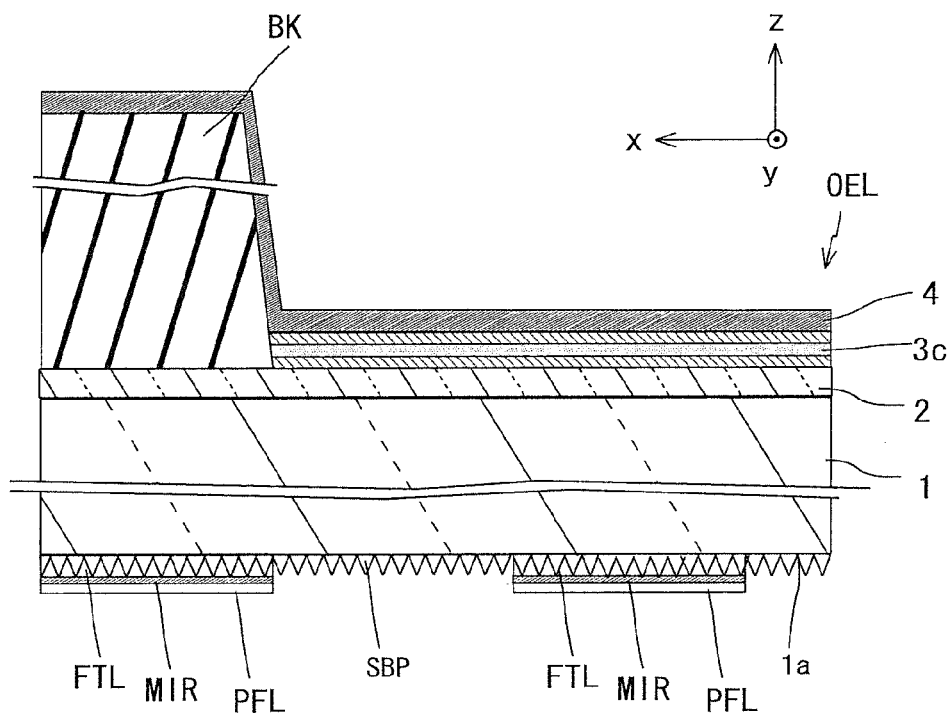
FIG. 14 is a schematic cross-sectional view of a part of a mirror device of an organic EL panel according to a fifth embodiment of the present invention.

As shown in FIG. 14, the fifth embodiment has a configuration that is the same as in the second embodiment except that a light extraction structure SBP such as a rough surface structure or a light extraction film is provided on the whole surface of a substrate, a flattening layer FTL is first formed at a predetermined position thereon, and a metal mirror surface portion MIR and a protection film PFL are layered only on the flattening layer FTL, that is, a region of only the metal mirror surface portion MIR is replaced by a layered body of the light extraction structure SBP, the flattening layer FTL, the metal mirror surface portion MIR, and the protection film PFL.

Light from the outside passes through the protection film PFL, and impinges on the metal mirror surface portion MIR and is reflected by the same. Light emitted from a light-emitting layer passes through an organic layer and a light-transmissive electrode 2, and proceeds toward a glass light-transmissive substrate 1, light with an angle that is equal to or more than a critical angle is totally reflected on an interface between the light-transmissive electrode 2 and the light-transmissive substrate 1, and the remaining part of light enters the glass light-transmissive substrate 1. The light that enters the light-transmissive substrate 1 enters the light extraction structure SBP at a region including no metal mirror surface portion MIR, and a part of the light is totally reflected due to randomness of the rough surface structure, and the remaining part is extracted into an air layer. Like the light that is reflected on the interface between the light-transmissive electrode 2 and the substrate 1, light that is reflected at a region including the layered body of the light extraction structure SBP, the flattening layer FTL, the metal mirror surface portion MIR, and the protection film PFL is reflected on a reflection electrode 4, a part of the light is extracted from the rough surface structure into the air layer, and the remaining part is reflected. Herein, the angle of emergence of light that is first emitted from the light extraction structure SBP is different from the angle of incidence of light that enters the light extraction structure SBP after the reflection on the metal mirror surface portion MIR. Therefore, the angle varies randomly, and light that proceeds toward the region including no metal mirror surface portion MIR can proceed toward the air layer at a certain ratio.

Sixth Embodiment

Hereinafter, in a sixth embodiment, a portion different from that in the first embodiment will be mainly described with reference to FIG. 15. Components represented by the same reference signs as in the first embodiment are the same as described above, and therefore the detailed description thereof will be omitted.

Figure 15:
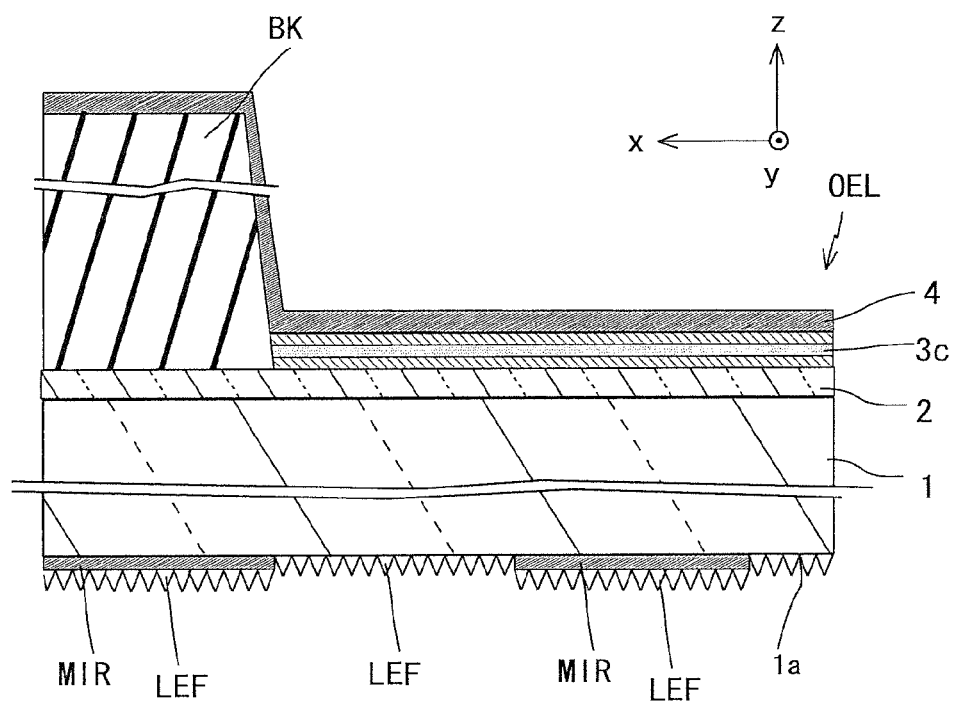
FIG. 15 is a schematic cross-sectional view of a part of a mirror device of an organic EL panel according to a sixth embodiment of the present invention.

As shown in FIG. 15, the sixth embodiment has the same configuration as in the fourth embodiment except that a flattening layer FLT of the fourth embodiment shown in FIG. 13 does not exist. In this case, a light extraction film LEF serves as a protection film of a metal mirror surface portion MIR.

Since light from the outside to the metal mirror surface portion MIR is not directly reflected, and passes through the light extraction film LEF, the mirror device is used as a decorative mirror just like frosted glass on a mirror or a reflection plate for bicycles. In particular, when the mirror device is used for a signboard in which a panel having a transmissive color character on the surface is disposed, or the like, the mirror device emits light even under no exposure to light at night, and can be distinguished, and light is reflected and diffusely reflected on the metal mirror surface portion MIR and the light extraction film LEF under exposure to light, to improve the visibility.

Seventh Embodiment

Hereinafter, in a seventh embodiment, a portion different from that in the first embodiment will be mainly described with reference to FIG. 16. Components represented by the same reference signs as in the first embodiment are the same as described above, and therefore the detailed description thereof will be omitted.

Figure 16:
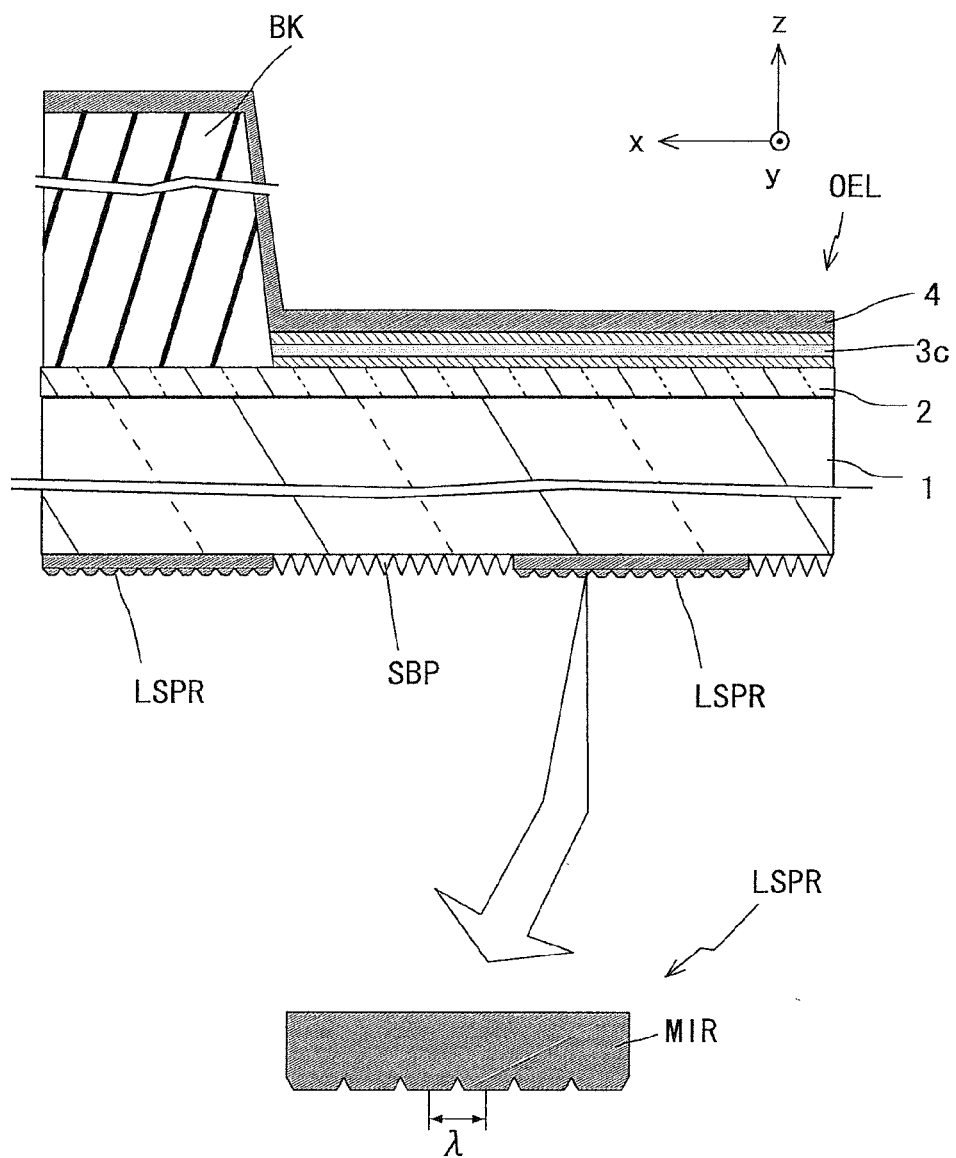
FIG. 16 is a schematic cross-sectional view of a part of a mirror device of an organic EL panel according to a seventh embodiment of the present invention, and a partial cross-sectional view thereof.

As shown in FIG. 16, the seventh embodiment has the same configuration as in the second embodiment except that a localized surface plasmon resonance structure LSPR is provided only on a metal mirror surface portion MIR. As the localized surface plasmon resonance structures LSPR, concavo-convex structure or irregularities with a wavelength size are formed on the surface of the metal mirror surface portion MIR. When light emitted from a light-emitting layer enters a metal thin film, surface plasmons are generated. When a resonance condition of the surface plasmons and the phase velocity of incident light coincide with each other, the surface plasmons can be radiated outside (see Japanese Patent Application Laid-Open No. 2006-313667).

In the mirror device according to any of the embodiments described above, a sealing member that covers the light-emitting portion of each of the plurality of organic EL elements formed on the back surface 1b of the substrate 1 and seals the organic EL elements is provided, which is not shown in the drawings. As the sealing member, a transparent dish-shaped sealing cap made of glass may be used. The transparent sealing cap is fixed around the light-emitting portion through an adhesive so as to cover the light-emitting portion. Thus, the light-emitting portion is sealed and protected. The transparent sealing cap may be sealed by charging the inside thereof with an inert gas or an inert liquid. As the sealing member, a sealing film with gas barrier properties made of a transparent resin such as poly(p-xylylene) and multilayers of an inorganic film such as silicon oxide film and an organic film may be used. As described above, it is preferable that the light-emitting portion of the organic EL element be configured so as not to come into contact with moisture and oxygen in the air using the sealing member.

In the embodiments described above, as the light-transmissive substrate 1, a plate of quartz glass or glass, a metal plate, a metal foil, a flexible resin substrate, a plastic film or sheet, or the like, can be used. In particular, a glass plate, and a transparent plate of synthetic resin such as polyester, polymethacrylate, polycarbonate, and polysulfone are preferred. In a case of using a synthetic resin substrate, gas barrier properties should be noted.

In the embodiments described above, the organic layer is formed from a light-emitting layered body, but a light-emitting layered body may be configured by layering inorganic material films.

In the embodiments described above, examples in which a plurality of organic EL elements R, G, and B are aligned is shown, but the present invention is not limited thereto. Even when a plurality of white light-emitting organic EL elements using a layered structure of light-emitting layer such as a tandem structure including a plurality of light-emitting layers or a mixed light-emitting layer are aligned for each color, the same effect can be obtained.

In the embodiments described above, the metal mirror surface portions MIRs are equally disposed. However, when the area of each of the metal mirror surface portions is much smaller than a light-emitting area of the organic EL elements, the metal mirror surface portions may be randomly disposed as long as the disposition of the metal mirror surface portions is visually checked as a uniform disposition.

REFERENCE SIGNS LIST 1 substrate
2 light-transmissive electrode
3 organic layer
3a hole injection layer
3b hole transport layer
3c light-emitting layer
3d electron transport layer
3e electron injection layer
4 reflection electrode
BK bank
MBL bus line
MIR metal mirror surface portion
OEL organic EL element
SBP light extraction structure

The invention claimed is:

1. A mirror device comprising:
a light-transmissive substrate; and
at least one organic EL element supported on a back surface of the light-transmissive substrate, the mirror device emitting light from a front surface of the light-transmissive substrate, wherein
the organic EL element has an organic layer containing a light-emitting layer layered between a light-transmissive electrode and a reflection electrode that are opposite to each other,
the light-transmissive electrode is formed on the light-transmissive substrate, and
the mirror device has a plurality of metal mirror surface portions that each have an area smaller than an area of the light-transmissive electrode and are distributed and disposed on the front surface of the light-transmissive substrate so as to be opposite to the light-emitting layer.

2. The mirror device according to claim 1, wherein the metal mirror surface portions are uniformly distributed.

3. The mirror device according to claim 2, wherein the metal mirror surface portions each have the same shape and the same area.

4. The mirror device according to claim 2, wherein the metal mirror surface portions each have a strip shape, and are aligned in stripes at constant intervals.

5. The mirror device according to claim 2, wherein the metal mirror surface portions are aligned in a matrix at constant intervals.

6. The mirror device according to claim 2, further comprising a light extraction structure provided between the metal mirror surface portions.

7. The mirror device according to claim 6, wherein the light extraction structure has a light extraction film adhered to the metal mirror surface portions.

8. The mirror device according to claim 6, wherein the light extraction structure has a rough surface formed on the metal mirror surface portions.

9. The mirror device according to claim 2, comprising a plurality of protrusions and a dielectric film that covers the protrusions, the protrusions being formed on each of the metal mirror surface portions periodically at intervals that are equal to the wavelength of light emitted from the light-emitting layer.

* * * * *